(12) United States Patent
Frederiksen et al.

(10) Patent No.: US 8,427,212 B2
(45) Date of Patent: Apr. 23, 2013

(54) PULSE WIDTH MODULATED SIGNAL GENERATION METHOD AND APPARATUS

(75) Inventors: Gene A. Frederiksen, River Falls, WI (US); Annabelle Pratt, Hillsboro, OR (US); Harish K. Krishnamurthy, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 98 days.

(21) Appl. No.: 12/973,335

(22) Filed: Dec. 20, 2010

(65) Prior Publication Data

US 2012/0154005 A1 Jun. 21, 2012

(51) Int. Cl.
*H03K 3/017* (2006.01)
*H03K 5/04* (2006.01)
*H03K 7/08* (2006.01)

(52) U.S. Cl.
USPC ............................ 327/175; 327/172; 327/173

(58) Field of Classification Search .................. 327/172, 327/173, 175
See application file for complete search history.

(56) References Cited

U.S. PATENT DOCUMENTS

| | | | |
|---|---|---|---|
| 7,453,387 B2 * | 11/2008 | Lee | 341/152 |
| 2011/0085575 A1 * | 4/2011 | Allie | 372/38.07 |
| 2011/0119513 A1 | 5/2011 | Krishnamurthy et al. | |
| 2011/0267019 A1 | 11/2011 | Krishnamurthy et al. | |

OTHER PUBLICATIONS

Jing Sun, "New Leading/Trailing Edge Modulation Strategies for Two-Stage PFC AC/DC Adapters to Reduce DC-Link Capacitor Ripple Current," Office of Graduate Studies of Texas A&M University, May 2007, 87 pages.
Yousefzadeh et al, "Hybrid DPWM with Digital Delay-Locked Loop," IEEE Compel Workshop, Rensselaer Polytechnic Institute, Troy, NY, USA, Jul. 16-19, 2006, 7 pages.

* cited by examiner

*Primary Examiner* — John Poos
(74) *Attorney, Agent, or Firm* — Schwabe, Williamson & Wyatt, P.C.

(57) ABSTRACT

Various embodiments associated with methods, apparatuses and systems, digital pulse width modulator (DPWM) comprising a counter logic, including a bitwise negator, and a delay-locked loop (DLL), are disclosed herein. The embodiments may potentially have a shorter processing delay, smaller footprint and/or less power consumption. Other embodiments be also be disclosed or claimed.

20 Claims, 8 Drawing Sheets

PULSE WIDTH MODULATED SIGNAL GENERATION METHOD AND APPARATUS

TECHNICAL FIELD

The present disclosure generally relates to integrated circuit, in particular, with respect to digital pulse width modulated signal generation methods and apparatuses.

BACKGROUND

Pulse width modulation is widely used in areas of power regulation and telecommunications. A simple digital pulse width modulator (DPWM) may include a counter and a comparator. A so-called "hybrid DPWM" may include a counter-based circuit (or a counter logic) and a delay-locked loop (DLL). The hybrid DPWM may achieve higher time resolution without using a high frequency clock signal because the DLL may subdivide a clock period via multiple delay elements. The counter logic may generate a control signal based on the duty cycle specific to the DPWM. The control signal may then propagate through the multiple delay elements of the DLL. The output of the DLL may be converted into a pulse width modulated signal (output signal) that may be used by a voltage regulator (VR) to control the voltage applied to a load.

A hybrid DPWM may use one or more subtractors, or logics that are configured to perform subtraction operations, to generate the control signal based on the duty cycle of the DPWM. Typically, a subtractor or subtraction logic may occupy a relatively significant amount of area and/or require a relatively significant amount of power to operate. Further, a subtractor or subtraction logic may limit the switching frequency of the VR, of which the DPWM may be supplying a pulse width modulated signal to.

BRIEF DESCRIPTION OF THE DRAWINGS

Embodiments of the present disclosure will be described by way of exemplary illustrations, but not limitations, shown in the accompanying drawings in which like references denote similar elements, and in which.

DETAILED DESCRIPTION OF ILLUSTRATIVE EMBODIMENTS

In the following detailed description, reference is made to the accompanying drawings which form a part hereof, and in which are shown by way of illustration embodiments in which the disclosure may be practiced. It is to be understood that other embodiments may be utilized and structural or logical changes may be made without departing from the scope of the present disclosure. Therefore, the following detailed description is not to be taken in a limiting sense, and the scope of embodiments in accordance with the present disclosure is defined by the appended claims and their equivalents.

Various operations may be described as multiple discrete operations in turn, in a manner that may be helpful in understanding embodiments of the present disclosure; however, the order of description should not be construed to imply that these operations are order dependent.

For the purposes of the description, a phrase in the form "A/B" or in the form "A and/or B" means (A), (B), or (A and B). For the purposes of the description, a phrase in the form "at least one of A, B, and C" means (A), (B), (C), (A and B), (A and C), (B and C), or (A, B and C). For the purposes of the description, a phrase in the form "(A)B" means (B) or (AB) that is, A is an optional element.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The description may use various terms, such as "gate," "divider," "bitwise negator," "comparator" and "summer," etc., to represent various components used in various embodiments. It is understood that these components may be implemented in various ways and/or be replaced by components of similar functionality. For example, a "comparator" may be implemented with multiple transistors of various polarities. Further, these components may be integrated into a single Application Specific Integrated Circuit (ASIC), Field Programmable Gated Array (FPGA), etc. Therefore, the terms used throughout this disclosure are for purpose of illustration only, not to be construed as limitations.

The terms "logics," "circuits," and "load" generally refer to a collection of one or more components that may or may not be used in various embodiments of this disclosure and may be synonymous.

Various embodiments of this disclosure may describe a digital pulse width modulator (DPWM) comprising a counter logic and a delay-locked loop (DLL) that may potentially have shorter processing delay, smaller footprint and less power consumption.

Figure 1:
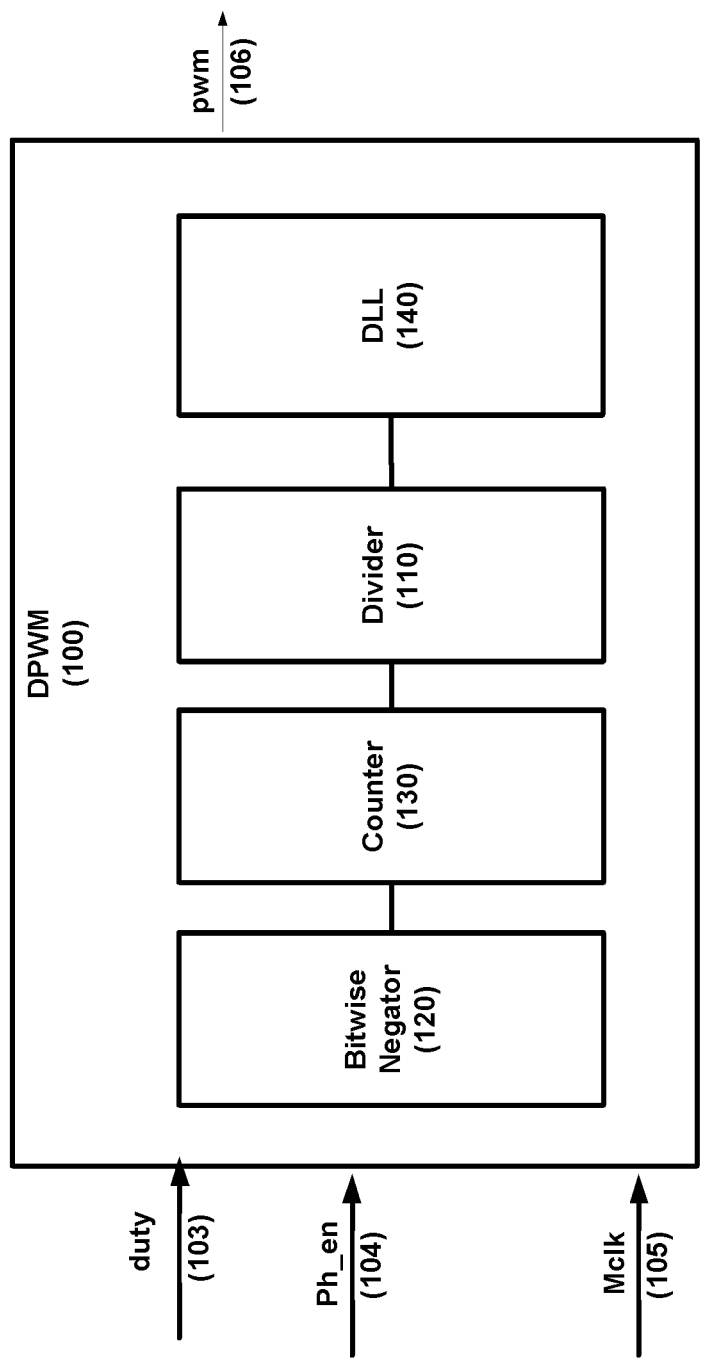
FIG. 1 is a block diagram illustrating a DPWM, in accordance with various embodiments of the present disclosure.

FIG. 1 is a block diagram illustrating a DPWM, in accordance with various embodiments of the present disclosure. For the embodiments, a DPWM 100 may include multiple input terminals 103, 104, 105, and an output terminal 106. The input terminal 103 may be configured to receive a duty cycle signal, duty. The input terminal 104 may be configured to receive a master clock signal, Mclk, and the input terminal 105 may be configured to receive a phase enable signal, Ph_en. The phase enable signal Ph_en may indicate a reference point, which may be a starting point, of each pulse width modulated output signal. The DPWM 100 may be configured to produce an output signal, pwm, via the output terminal 106. In various embodiments, depending on whether the DPWM 100 operates in a single phase mode, the phase enable signal, Ph_en, and the corresponding input terminal 106 may be optional. The output signal pwm may be based on the duty cycle signal, duty, received from the input terminal 103, and may be used by a voltage regulator to control power delivered to a load.

In various embodiments, DPWM 100 may include a bitwise negator 120, a divider 110 and a counter 130. In various embodiments, the DPWM 100 may include an optional DLL 140. In various embodiments, depending on the type of modulation used by the DPWM 100, the divider 110 may also be optional. Further details of the DPWM 100, including the bitwise negator 120, the counter 130, and the optional divider 110 and the optional DLL 140 will be discussed in later sections of this disclosure. Even though FIG. 1 illustrates the various sub-components of the DPWM 100 as distinct components, the bitwise negator 120, the counter 130, and the optional divider 110 and the optional DLL 140, and/or one of their sub-components may be integrated into a single component or further subdivided. Furthermore, the DPWM 100 may include other components, such as clocks and logic gates that are not shown in FIG. 1.

Figure 2:
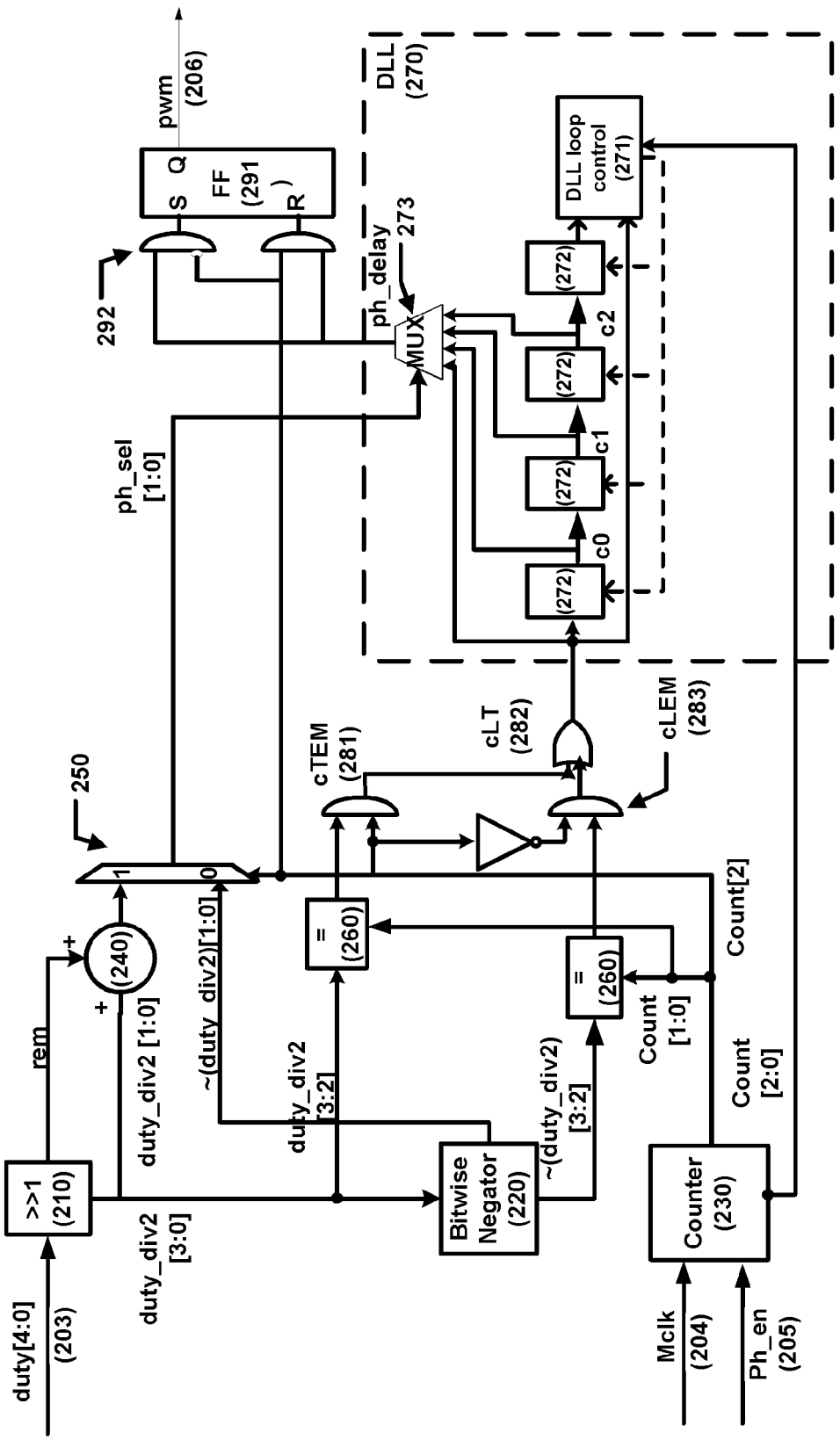
FIG. 2 is a block diagram of a DPWM including a DLL, in accordance with various embodiments of the present disclosure.

FIG. 2 is a block diagram illustrating a DPWM that includes a DLL, in accordance with various embodiments of the present disclosure. In various embodiments, a DPWM 200 similar to the DPWM 100 as illustrated in FIG. 1 may include a DLL 270 as outlined by the dash-lined box. The DPWM 200 may have multiple input terminals 203, 204, 205, and an output terminal 206. Similar to the DPWM 100, the input terminal 203 may be configured to receive the duty cycle signal, duty. The input terminal 204 may be configured to receive a master clock signal, Mclk, and the input terminal 205 may be configured to receive a phase enable signal, Ph_en, which may indicate reference points of each pulse width modulated output signal. Similar to the DPWM 100, the phase enable signal Ph_en, and the input terminal 205 may be optional. The DPWM 200 may be configured to produce an output signal, pwm, via the output terminal 206.

In various embodiments, the DPWM 200 may include a divider 210, a bitwise negator 220, a counter 230, a summer 240, and various other components, such as a multiplexer (mux) 250, one or more comparators 260, a flip flop 291, and logic gates 281, 282, 283, and 292, coupled to each other as shown. In particular, the various components of the DPWM 200 may be coupled to each other and configured to generate or produce (hereinafter, simply "produce") one or more control signals, cLEM, cTEM, and cLT, and a phase select signal, ph_sel. More details on how to produce the signals cLEM, cTEM, cLT and ph_sel and how to produce the output signal pwm based on these signals will be described in later sections.

Even though FIG. 2 illustrates various distinct components of the DPWM 200, it is understood that these components are illustrated for purpose of demonstrating the operation of the DPWM 200, and some of these components may be combined or further subdivided. For example, the two comparators 260 illustrated in FIG. 2 may be implemented as a single comparator. Furthermore, even though FIG. 2 illustrates the DLL 270 and various components of the DPWM 200 as separate components, it is understood that various components of the DPWM 200 may be integrated into the DLL 270. For example, one or more logic gates of 281, 282 and 283 may be integrated into the DLL 270. The operations of various individual components of the DPWM 200 are well known, and therefore are not described here. The interactions of these components are illustrated below.

In various embodiments, the DLL 270 may include one or more delay elements 272, a DLL loop control 271, a mux 273, and various other components coupled to each other as shown. In particular, the various components of the DLL 270 may be coupled together. The DLL 270 may be coupled to the various components of the DPWM 200, including the logic gate 282, and configured to receive the signals cLT and ph_sel and to generate the output signal pwm based on the signals cLT and ph_sel. In various embodiments, the signal cLT may propagate through the one or more delay elements 272. The signal ph_sel may control the amount of delay applied to the signal cLT via the mux 273. Accordingly, an output signal of the mux 273, ph_delay, may represent a delayed version of the cLT. The signal ph_delay may be coupled to the flip-flop 291 to produce the output signal pwm, the details of which will be described in later sections of this disclosure.

In various embodiments, the divider 210 may be configured to divide the signal duty by 2. In various embodiments, the divider 210 may be configured to divide the signal duty by 2 by right shifting the signal duty by one bit. The divider 210 may produce two signals, duty_div2 and rem, wherein the signal duty_div2 may represent the quotient of the division in the form of an integer, and the signal rem may represent the remainder of the division.

In various embodiments, the bitwise negator 220 may be coupled to the divider 210 and configured to negate all or part of the bits of the signal duty_div2, and produce a signal ~(duty_div2). Even though FIG. 2 illustrates the bitwise negator 220 having two separate outputs, respectively coupled with the mux 250 and the comparator 260, it is understood that the bitwise negator 220 may produce a single signal ~(duty_div2), which may be independently routed to various other components.

In various embodiments, the summer 240 may be coupled to the divider 210 and configured to produce a sum based on the signal duty_div2 and the remainder rem. The mux 250 may be coupled to the summer 240 and the bitwise negator 220. The mux 250 may be configured to produce the signal ph_sel based on the most significant bit of the counter signal generated by the counter 230.

In various embodiments, the DPWM 200 may use triangular modulation (also known as symmetrical on-time or dual-edge modulation), in which leading edge modulation (LEM) may be used during a first portion of the switching cycle, and trailing edge modulation (TEM) may be used during a second portion of the switching cycle. Accordingly, the counter logic 201 may be configured to generate the control signal cLT based on a leading edge modulation control signal, cLEM, during the first portion of the switching cycle, and a trailing edge modulation control signal, cTEM, during the second portion of the switching cycle.

In various embodiments, the DPWM 200 may receive, for example, a 5-bit duty cycle signal via the input terminal 203. The counter 230 may be a 3-bit counter. The DLL 270 may include, for example, four individual delay elements 272, thereby providing a 2-bit resolution within the DLL 270. The 3-bit resolution provided by the counter 230 and the 2-bit resolution provided by the DLL 270 may be configured to provide the 5-bit resolution (i.e., the number of bits) specified by the signal duty received from input terminal 203. It is understood that a 5-bit duty cycle signal duty is described here and illustrated in FIG. 2 for the purpose of demonstrating the operation of the DPWM 200. In various embodiments of the present disclosure, the duty cycle signal duty received by the input terminal 203 may be more or less than 5 bits. Furthermore, the respective resolutions of the counter logic 201 and the DLL 270 may also vary. In various embodiments, the combined resolution of the counter logic 201 and the DLL 270 may be higher, lower, or equal to the resolution of the duty cycle.

In various embodiments, during the first portion of the switching cycle, in which LEM may be used, the output signal pwm should be kept low for a duration of about ($2^N-1-$duty_div2), in which N may represent the number of bits contained in the duty cycle. Table I demonstrates calculations of various durations related to the duty cycle, based on an exemplary 5-bit duty cycle value "01101." As demonstrated in Table I, the value of ($2^N-1-$duty_div2) may be about equal to the bitwise negated value of duty_div2, denoted as ~duty_div2 in Table I. It is understood that the various values as illustrated in Table I are for purpose of demonstration only. In various embodiments, the duty cycle may be different from "01101," and the other values may change accordingly.

TABLE I

Example durations related to a duty cycle of "01101"

| | Binary Value | MSB [3:2] | LSB [1:0] |
|---|---|---|---|
| duty | 01101 | | |
| duty_div2 | 0110 | 01 | 10 |
| $2^{N-1}-1-$duty_div2 | 1001 | 10 | 01 |
| ~duty_div2 | 1001 | 10 | 01 |

In various embodiments, as illustrated in Table I, the signals duty_div2 and ~(duty_div2) may include two portions, a most significant bits portion and a least significant bits portion. In various embodiments, the least significant bits portions of the signals duty_div2 and ~duty_div2 may include a number of bits that is based on the resolution of the DLL 270. Subsequently, the remaining bits of the signals duty_div2 and ~duty_div2 may be the most significant bits portions. For example, if the DLL 270 include 4 delay elements, the DLL 270 may support a 2-bit resolution, and the least significant bits portions of the signals duty_div2 and ~(duty_div2) may include the least significant 2 bits of the signals duty_div2 and ~(duty_div2), which may be denoted as duty_div2[1:0] and ~duty_div2[1:0]. If the signals duty_div2 and ~duty_div2 each have a total of 4 bits (N−1=4), then the most significant bits portions of the signals duty_div2 and ~duty_div2 may be denoted as duty_div2[3:2] and ~duty_div2[3:2]. It is understood that the number of bits contained in the least/most significant bits portions of signals duty_div2 and ~duty_div2 as illustrated in FIG. 2 and Table I are for purpose of illustrating the operation of the DPWM 200. And the number of bits contained in the least/most significant bits portions of signals may vary depending on the number of bits contained in the signal duty, the resolutions of the DLL, etc.

In various embodiments, the signals count may include a most significant bit portion and a least significant bits portion, wherein the least significant bits portion of the signal count may include all the remaining bits of the signal count, without the most significant bit. For example, if the counter 230 is a 3-bit counter, then a most significant bit portion of count may be expressed as count[2], and the least significant bits portion of count may be expressed as count[1:0]. In various embodiments of this disclosure, the number of bits contained in the least significant bits portion of the signal count may or may not be equal to the number of bits contained in the most significant bits portions of the signals duty_div2 and ~duty_div2.

In various embodiments, during the first portion of the switching cycle, in which LEM may be used, the most significant bit of the counter signal, such as the signal count[2] for a 3-bit counter, may be 0. Accordingly, the output signal of the AND gate 281, cTEM, may be set to 0, which may lead to the cLT signal being based on the leading edge modulation control signal, cLEM. Furthermore, when the most significant bit of the counter signal is 0, the signal ph_sel may be set based on the least significant bits portion of the signal ~duty_div2, such as ~duty_div2[1:0].

In various embodiments, during the first portion of the switching cycle, the output signal pwm and the control pulse signal cLEM may initially be set to low. The signal cLEM may be set to high when the least significant bits portion of the counter signal, such as count[1:0] for a 3-bit counter, equals to the most significant bits portion of ~duty_div2, such as ~duty_div2 [3:2]. The signal cLEM may pass through the chain of successive delay elements 272 in the DLL 270, each of which may delay the signal cLEM by a fraction (in this case, a quarter) of the clock period. The DLL loop control 271 may help ensure equal division of the clock period among the multiple delay elements 272. The output of each delay element may be provided to the mux 273, respectively. The signal ph_sel may specify which delayed cLT signal may be used as the signal ph_delay. The signal ph_delay may be applied to a Set (S) input of the flip-flop 291. As the most significant bit of the counter signal, such as count[2], may be zero during the first portion of the switching cycle, when the signal ph_delay pulses high, the output signal pwm may be set to high accordingly.

In various embodiments, during the second portion of the switching cycle, in which TEM may be used, the most significant bit of the signal count, count[2], may be 1. Since the AND gate 283 may be coupled to the inverse of the most significant bit of the signal count, the output of the AND gate 283 may be set to 0. Accordingly, the signal cLT may be based on the output of the AND gate 281, which is the signal cTEM. The signal cTEM may pulse high when the least significant bits portion of the signal count, such as count[1:0], are equal to the most significant bits portion of duty_div2, such as duty_div2[3:2]. The signal ph_sel may be set based on the sum of the least significant bits portion of duty_div2, such as duty_div2[1:0], and the remainder rem, as provided by the summer 240. Accordingly, a remainder rem may be added to the trailing edge when the remainder rem is not 0, which would offset the output signal pwm with respect to its midpoint by one or more delay increments caused by the DLL. However, this imbalance may not be significant in a DPWM with high resolution and may therefore be tolerable. The signal ph_delay may be coupled to a Reset (R) input of the flip-flop 291. As the most significant bit of the counter may be high during the second portion of the switching cycle, if ph_delay pulses high, the output signal pwm may be set to low accordingly.

In various embodiments, the DPWM 200 may use other modulation schemes, including leading edge modulation and trailing edge modulation. And various components of the DPWM 200 may be accordingly adjusted to produce the output signal pwm in accordance with the modulation scheme.

Figure 3:
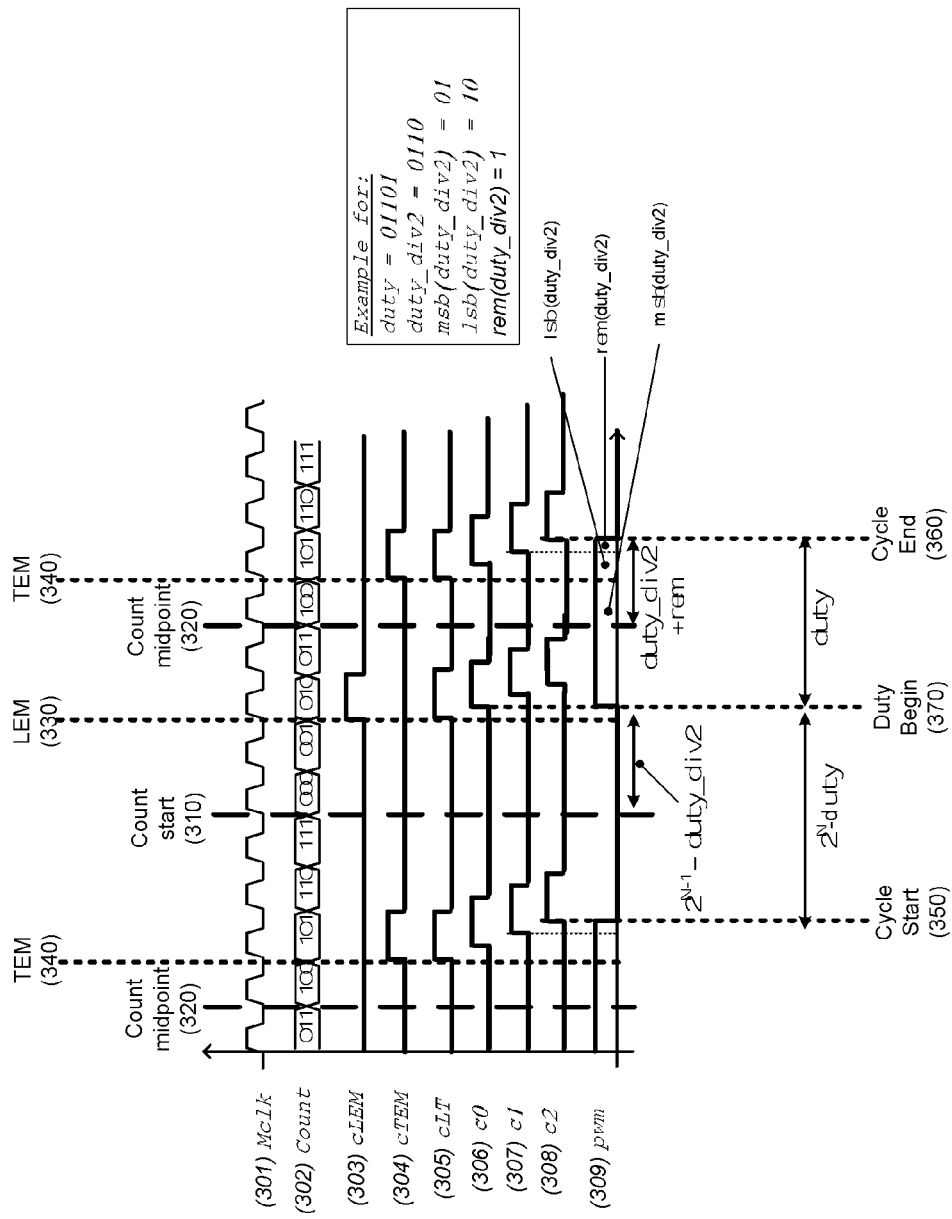
FIG. 3 is a timing diagram illustrating waveforms of various signals of a DPWM as illustrated in FIG. 2, in accordance with various embodiments of the present disclosure.

FIG. 3 is a timing diagram illustrating waveforms of various signals of the DPWM 200, in accordance with various embodiments of the present disclosure. As illustrated in FIG. 3, the DPWM 200 may be configured to receiving a duty cycle signal, such as "01101." A master clock waveform 301 may correspond to the Mclk signal received by the terminal 204. A counter waveform 302 may correspond to the signal count produced by the counter 230. A LEM control signal waveform 303 may correspond to the signal cLEM produced by the AND gate 283. A TEM control waveform 304 may correspond to the signal cTEM produced by the AND gate 281. A LEM/TEM combined control waveform 305 may correspond to the signal cLT produced by the OR gate 282. A control waveform 309 may correspond to the output signal pwm. Waveforms 306, 307, and 308 may correspond to respective delayed versions of the signal cLT after the signal cLT propagates through one or more delay elements 272. In various embodiments of this disclosure, the beginning of a switching cycle for the DPWM 200 may be indicated by a counter start point 310. The first portion and the second portion of the switching cycle may be separated by a counter midpoint 320. The signal cLEM may be set high as the counter waveform reaches about a LEM point 330. The signal cTEM may be set high as the counter waveform reaches about a TEM point 340.

In various embodiments, the switching cycle for the DPWM 200 may begin from about the counter start point 310. At the start of a switching cycle 310, the DPWM 200 may set the signal pwm to low. During the first portion of the switching cycle, the DPWM 200 may use LEM, and may keep the signal pwm low until it reaches a duty cycle begin point 370. The DPWM 200 may set the signal pwm high at about the duty cycle begin point 370. The DPWM 200 may keep the signal pwm high until at least the counter midpoint 320. At about the counter midpoint 320, the second portion of the switching cycle may begin, and the DPWM 200 may use TEM. During the second portion of the switching cycle, the DPWM 200 may keep the signal pwm high until it reaches the duty cycle end point 360. At about the duty cycle end point 360, the DPWM 200 may set the signal pwm to low. Accordingly, the DPWM 200 may produce the signal pwm with a switching cycle period from about the duty cycle start point 350 to about the duty cycle end point 360. And the DPWM 200 may set the signal pwm to high from about the duty begin point 370 to about the duty cycle end point 360, in accordance to the duty cycle signal received at the input terminal 203.

In various embodiments, during the first portion of the switching cycle, the DPWM 200 may be configured to keep the signal pwm at low for $2^{N-1}$–duty_div2 clock cycles, in which N may represent the number of bits contained in the duty cycle. Since the clock cycle count begins with 0, not 1, the value of the ($2^{N-1}$–duty_div2)th clock cycle may be represented as ($2^N$–1–duty_div2). As previously illustrated in Table I, ($2^{N-1}$–duty_div2) may be about equal to ~duty_div2. Therefore, the subtraction operation may be replaced by a bitwise negation operation. Experience has shown that using the bitwise negator 220 instead of one or more subtractors may potentially reduce the footprint (e.g., required area) and/or the power consumption of the DPWM. Furthermore, it may potentially support voltage regulators (VRs) with high switching frequencies, which could make use of digital controls instead of analog controls. This may potentially lead to higher yields for the digital controllers, higher test coverage by testers in the high volume manufacturing environment, and may potentially reduce the time required in porting integrated voltage regulators (VRs) from one process node to another.

Figure 4:
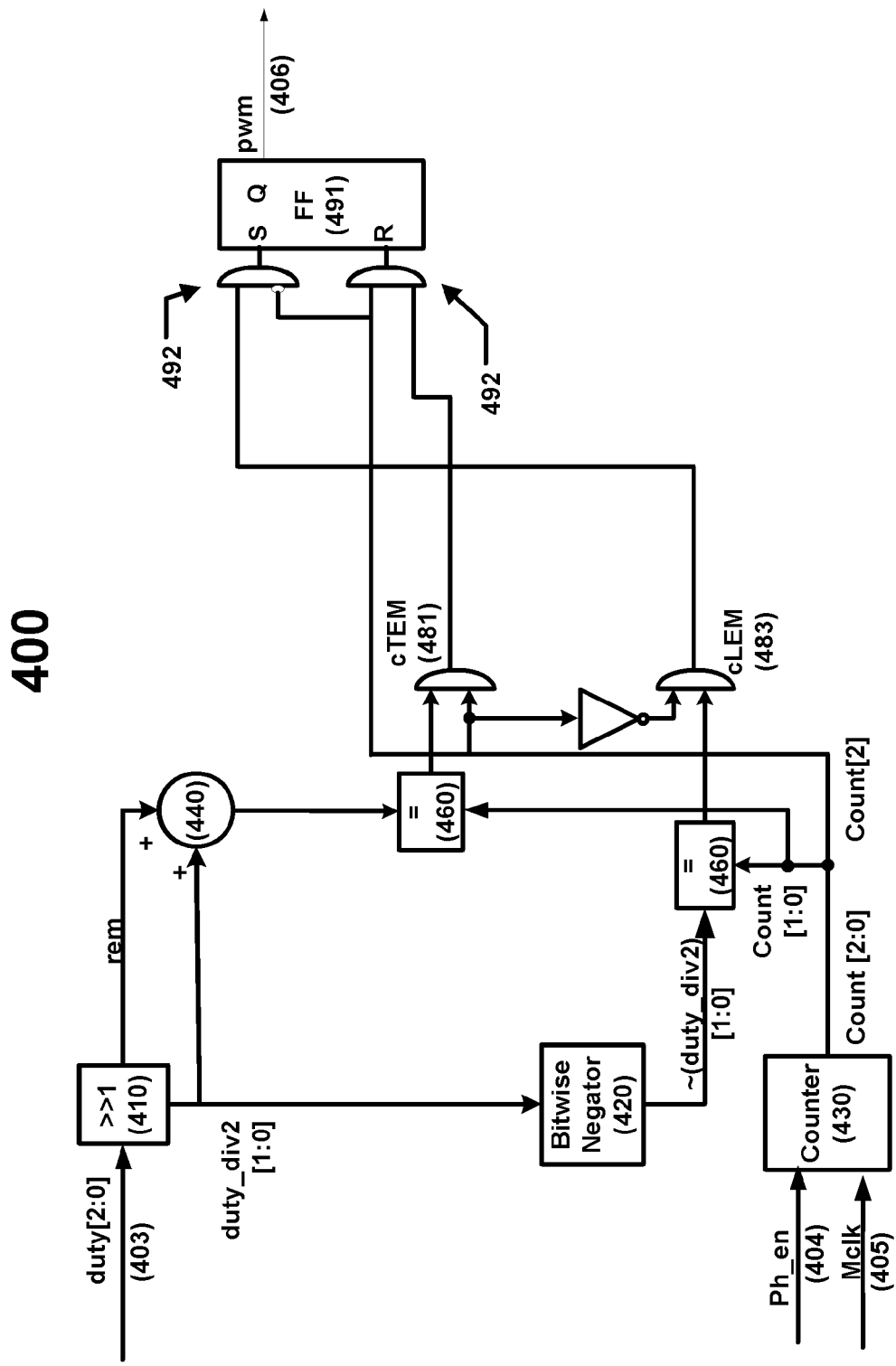
FIG. 4 is a block diagram of a DPWM without a DLL, in accordance with various embodiments of the present disclosure.

FIG. 4 is a block diagram illustrating a DPWM without a DLL in accordance with various embodiments of the present disclosure. In various embodiments, a DPWM 400 may include multiple input terminals 403, 404, 405, and an output terminal 406. Similar to the DPWM 200, the input terminal 403 may be configured to receive the duty cycle signal, duty. The input terminal 404 may be configured to receive a master clock signal, Mclk, and the input terminal 405 may be configured to receive a phase enable signal, Ph_en, which may indicate reference points of each pulse width modulated output signal. Similar to the DPWM 200, the phase enable signal Ph_en, and the input terminal 405 may be optional. The DPWM 400 may be configured to produce an output signal, pwm, via the output terminal 406.

In various embodiments, the DPWM 400 may include a divider 410, a bitwise negator 420, a counter 430, a summer 440, and various other components, such as a multiplexer (mux) 450, one or more comparators 460, a flip flop 491, and logic gates 481, 483, and 492, coupled to each other as shown. Similar to the DPWM 200, the various components of the DPWM 400 may be coupled to each other and configured to produce one or more control signals, cLEM, cTEM. Unlike the DPWM 200 as illustrated in FIG. 2, the DPWM 400 may not include a DLL. In addition, various other components of the DPWM 400 may be arranged differently as the DPWM 200. For example, the outputs 481 and 483 may be coupled to the flip flop 491 to produce the output signal pwm. Since the DPWM 400 does not include a DLL to further subdivide every clock period indicated by the counter 430, the DPWM 400 may support a signal duty as precise as the signal count.

Figure 5:
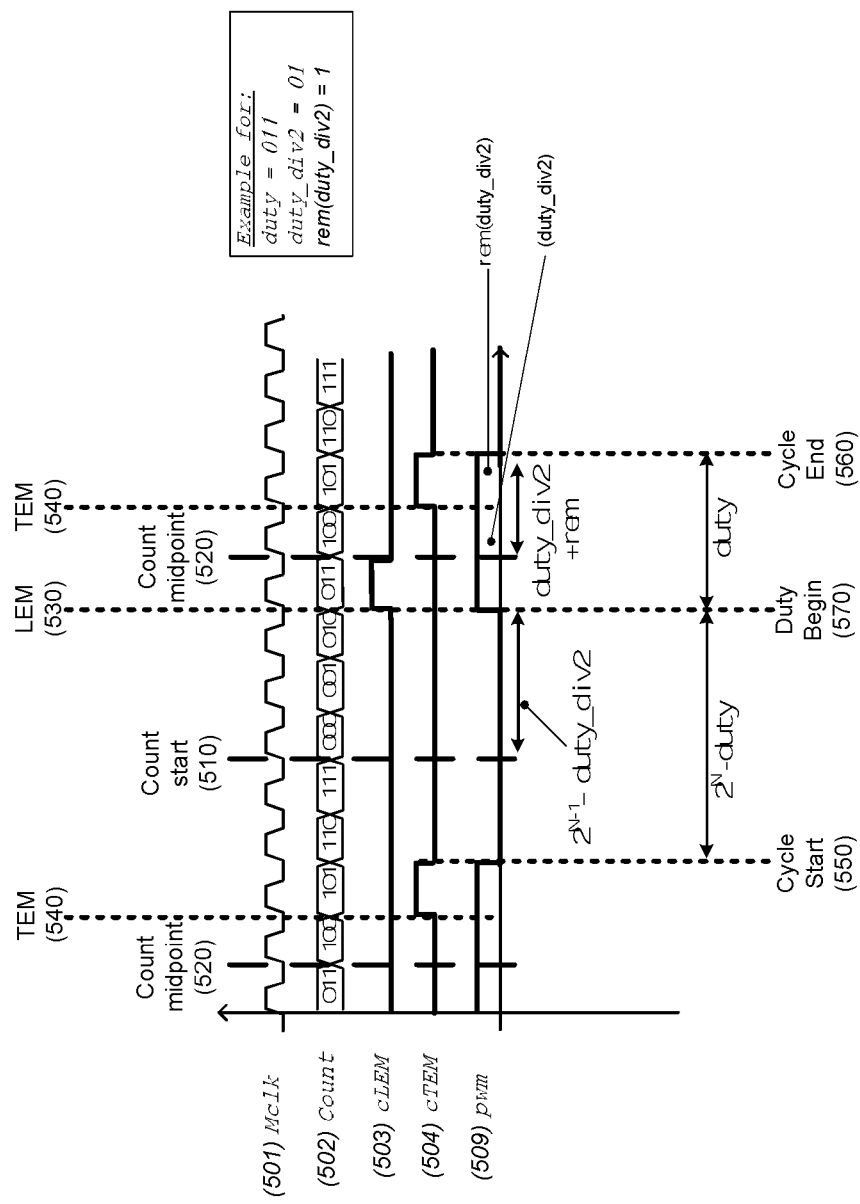
FIG. 5 is a timing diagram illustrating waveforms of various signals of a DPWM as illustrated in FIG. 4, in accordance with various embodiments of the present disclosure.

FIG. 5 is a timing diagram illustrating waveforms of various signals of the DPWM 400, in accordance with various embodiments of the present disclosure. In FIG. 5, the DPWM 400 may be configured to receiving a duty cycle signal, such as "011." As illustrated in FIG. 5, a master clock waveform 501 may correspond to the Mclk signal received by the terminal 404. A counter waveform 502 may correspond to the signal count produced by the counter 430. A LEM control signal waveform 503 may correspond to the signal cLEM produced by the AND gate 483. A TEM control waveform 404 may correspond to the signal cTEM produced by the AND gate 481. A control waveform 409 may correspond to the output signal pwm. In various embodiments of this disclosure, the beginning of a switching cycle for the DPWM 400 may be indicated by a counter start point 510. The first portion and the second portion of the switching cycle may be separated by a counter midpoint 520. The signal cLEM may be set high as the counter waveform reaches about a LEM point 530. The signal cTEM may be set high as the counter waveform reaches about a TEM point 540. In various embodiments, the operations of the various components, including the divider 410, the bitwise negator 420, the counter 430, the summer 440 and the flip flop 491 may be similar to the corresponding components in the DPWM 200. Therefore, the details of how to generate the signals cLEM, and cTEM by the DPWM 400 are not repeated herein.

Figure 6:
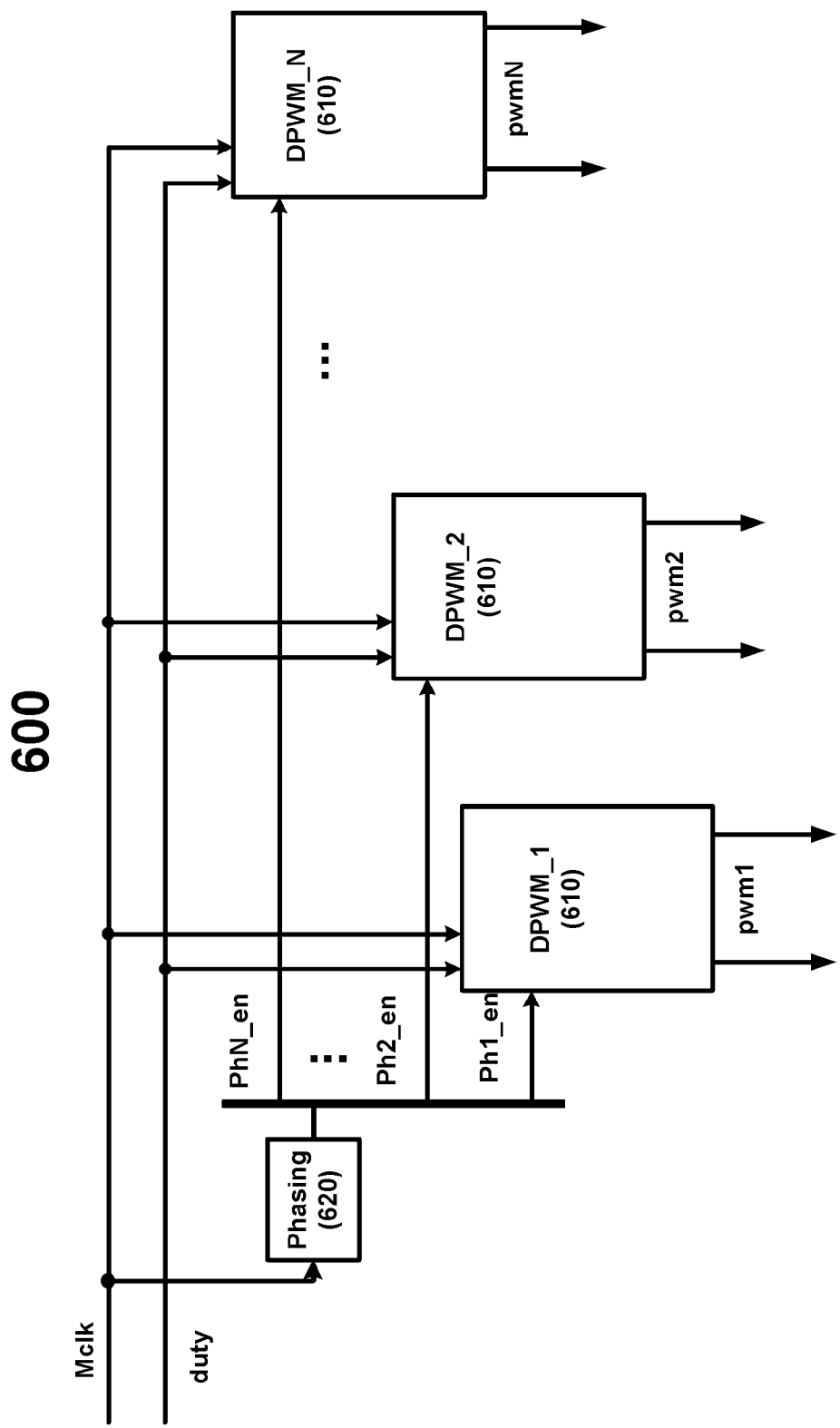
FIG. 6 is a block diagram illustrating a multi-phase DPWM, in accordance with various embodiments of the present disclosure.

FIG. 6 is a block diagram illustrating a multi-phase DPWM, in accordance with various embodiments of the present disclosure. In FIG. 6, a multi-phase DPWM 600 may include multiple DPWMs 610, identified as DPWM_1, DPWM_2, ... DPWM_N. Each one of the multiple DPWMs 610 may be similar to the DPWMS 200 or DPWMs 400 as earlier described. The phase enable signals Ph1_en through PhN_en may be correspondingly phase shifted by a phasing block 620. The DPWM 600 may produce multiple output signals, pwm1, pwm2, ... pwmN, that are phase shifted accordingly.

Figure 7:
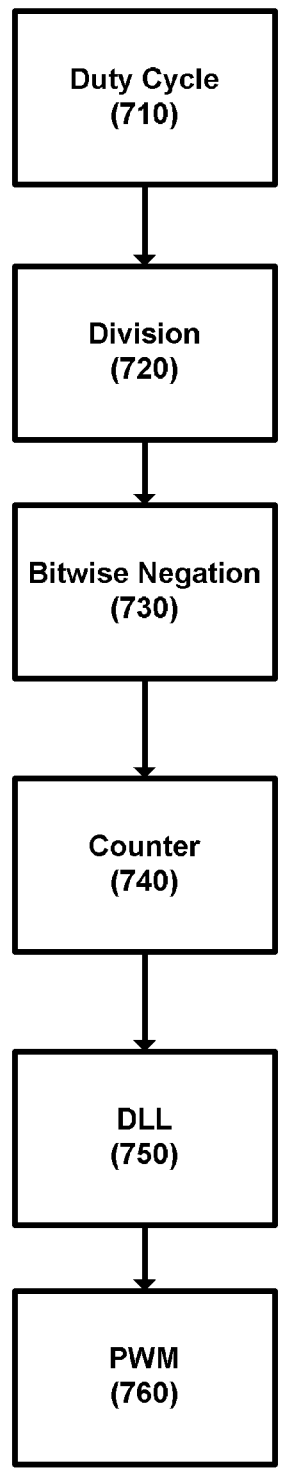
FIG. 7 is a flow diagram illustrating a portion of the operations of a DPWM, in accordance with various embodiments of the present disclosure.
Figure 8:
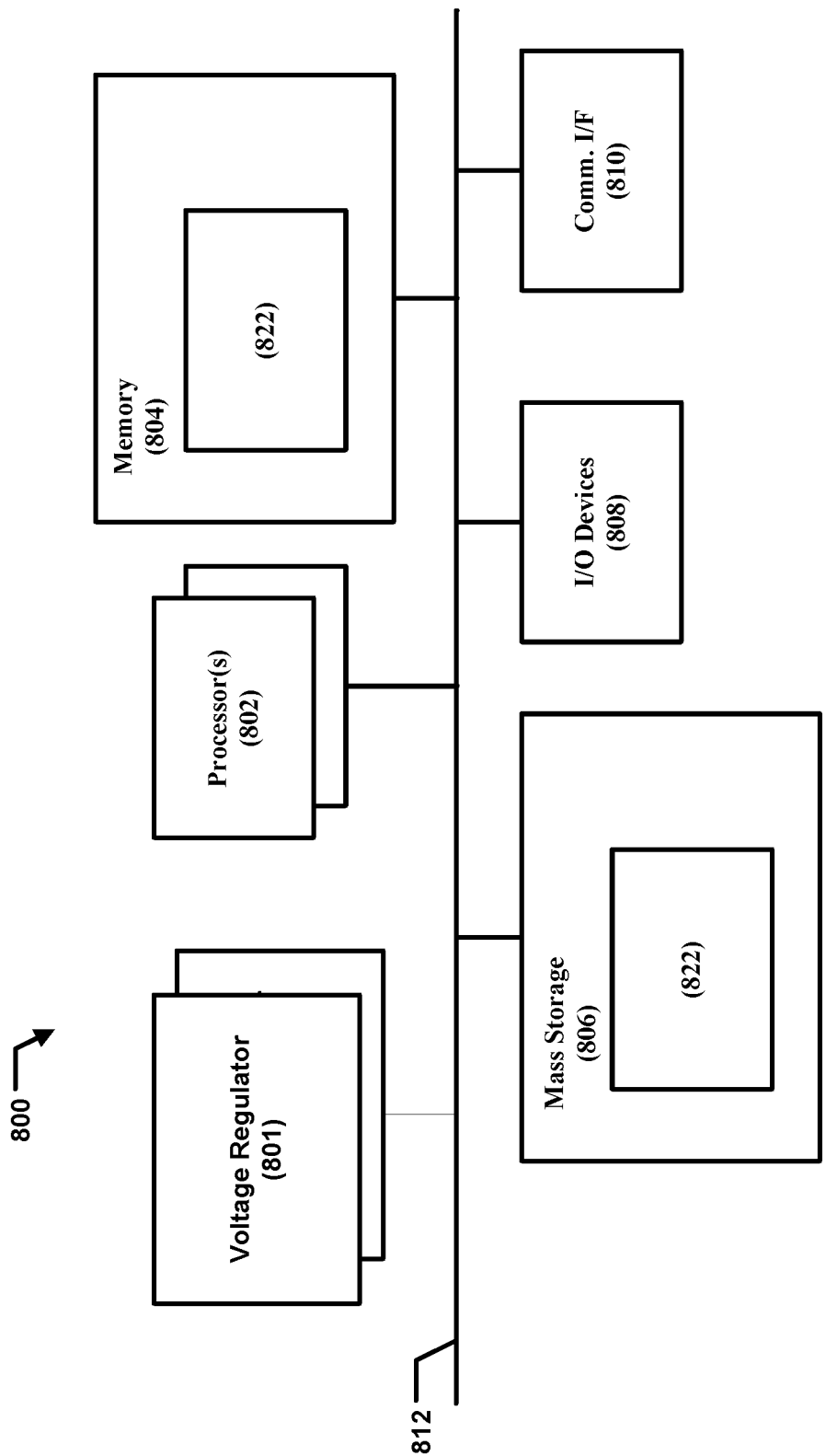
FIG. 8 illustrates an example computer system suitable for use to practice various aspects of the described methods and/or apparatus, in accordance with various embodiments of the present disclosure.

FIG. 7 is a flow diagram illustrating a portion of operations of a DPWM, in accordance with various embodiments of the present disclosure. A DPWM similar to the DPWMs 200 or 400 described earlier may receive, or otherwise be provided, a duty cycle signal in block 710. The duty cycle signal may be divided by half in block 720, and the divided duty cycle signal may be bitwise negated in block 730. Furthermore, a counter signal may be generated in block 740. One or more control signals based on the operations described in 720, 730 and 740 may be generated. These one or more control signals may be provided to a DLL in box 750, from which a pulse width modulated control signal pwm may be generated in box 760.

FIG. 6 illustrates an example computer system suitable for use to practice various aspects of the earlier described methods and apparatuses, in accordance with embodiments of the present disclosure. As shown, a computing system 800 may include a number of voltage regulators 801, a number of processors or processor cores 802, a system memory 804, a mass storage 806, and a communication interface 810. For the purpose of this application, including the claims, the terms "processor" and "processor cores" may be considered synonymous, unless the context clearly requires otherwise.

In various embodiments, the voltage regulator 801 may include a one of the various embodiments of the DPWM as previously described.

In various embodiments, the communication interface 810 may receive and/or transmit data via a receiver and a transmitter, respectively, over a wired and/or wireless network. Communication interface 810 may be coupled to an antenna (not shown). The antenna may include one or more directional or omni-directional antennas such as dipole antennas, monopole antennas, patch antennas, loop antennas, microstrip antennas, and/or other types of antennas suitable for transmission of RF signals.

Additionally, the computing system 800 may include one or more tangible, non-transitory computer-readable mass storage devices 806 (such as diskette, hard drive, compact disc read only memory (CDROM) and so forth), input/output devices 808 (such as keyboard, cursor control and so forth). The elements may be coupled to each other, and the earlier enumerated elements via system bus 812, which represents one or more buses. In the case of multiple buses, they may be bridged by one or more bus bridges (not shown).

Each of these elements may perform its conventional functions known in the art. In particular, the system memory 804 and the mass storage 806 may be employed to store a working copy and a permanent copy of the programming instructions implementing one or more operating systems, firmware modules or drivers (in particular, firmware modules or drivers in support of the DPWM), applications, and so forth, herein collectively denoted as 822.

The permanent copy of the programming instructions may be placed into the permanent storage 806 in the factory, or in the field, through, for example, a distribution medium (not shown), such as a compact disc (CD), or through the communication interface 810 (from a distribution server (not shown)). That is, one or more distribution media having an implementation of the agent program may be employed to distribute the agent and program various computing devices.

The remaining constitution of these elements 801-812 are known, and accordingly will not be further described.

Although specific embodiments have been illustrated and described herein, it will be appreciated by those of ordinary skill in the art that a wide variety of alternate and/or equivalent implementations may be substituted for the specific embodiments shown and described, without departing from the scope of the embodiments of the present disclosure. This application is intended to cover any adaptations or variations of the embodiments discussed herein. Therefore, it is manifestly intended that the embodiments of the present disclosure be limited only by the claims and the equivalents thereof.

What is claimed is:

1. An apparatus comprising:
    a bitwise negator configured to bitwise negate each of a plurality of bits of an integer value indicative of a duty cycle of a pulse width modulated signal; and
    a counter coupled to the bitwise negator and configured to produce a counter signal based on a clock signal, wherein the counter and the bitwise negator are further configured to cooperatively facilitate a production of the pulse width modulated signal based on the bitwise negated integer value.

2. The apparatus of claim 1, wherein the integer value indicative of a duty cycle of a pulse width modulated signal equals to about half of the duty cycle of the pulse width modulated signal, and the apparatus further comprises a divider configured to divide another integer value representing the duty cycle of the pulse width modulated signal to produce the integer value equal to about half of the duty cycle of the pulse width modulated signal.

3. The apparatus of claim 1, further comprising:
    a delay locked loop (DLL) coupled to the bitwise negator and the counter;
    wherein the counter has a first resolution;
    wherein the DLL has a second resolution;
    wherein the duty cycle has a third resolution; and
    wherein a combined resolution of the counter and the DLL based on the first resolution and the second resolution is equal to or higher than the third resolution of the duty cycle.

4. The apparatus of claim 1, wherein the pulse width modulated signal includes a plurality of switching cycles, wherein each of the respective switching cycles of the pulse width modulated signal is divided into a first portion in which the pulse width modulated signal is on and a second portion in which the pulse width modulated signal is off, and wherein the at least one of the first portions and the second portions of the respective switching cycles of the pulse width modulated signal are based on a trailing edge modulation.

5. The apparatus of claim 4, another one of the first portions and the second portions of the respective switching cycles of the pulse width modulated signal based on a leading edge modulation.

6. The apparatus of claim 3, further comprising one or more logic gates coupled to the bitwise negator and the DLL and configured to produce an input signal to the DLL based on a most significant bits portion of the bitwise negated integer value indicative of the duty cycle, wherein the input signal to the DLL is to be delayed by one or more delay elements of the DLL.

7. The apparatus of claim 6, further comprising a multiplexer coupled to the bitwise negator and the DLL and configured to produce a control signal to the DLL based on a least significant bits portion of the bitwise negated integer value indicative of the duty cycle, wherein the control signal to the DLL at least partially determines an amount of delay to the input signal.

8. A method comprising:
    bitwise negating each of a plurality of bits of an integer value indicative of a duty cycle of a pulse width modulated signal;
    producing a counter signal based on a clock signal; and
    producing the pulse width modulated signal based on the bitwise negated integer value indicative of the duty cycle and the counter signal.

9. The method of claim 8, wherein the integer value indicative of a duty cycle of a pulse width modulated signal equals to about half of the duty cycle of the pulse width modulated signal, and the method further comprises:
    dividing another integer value equal to the duty cycle of the pulse width modulated signal to produce the integer value indicative of the duty cycle of the pulse width modulated signal.

10. The method of claim 8, wherein the pulse width modulated signal includes a plurality of switching cycles, and the method further comprising:

producing at least a portion of each of the respective switching cycles of the pulse width modulated signal based on leading edge modulation.

11. The method of claim 8, wherein the pulse width modulated signal includes a plurality of switching cycles, and the method further comprising:

producing at least a portion of each of the respective switching cycles of the pulse width modulated signal based on trailing edge modulation.

12. The method of claim 8, wherein the pulse width modulated signal includes a plurality of switching cycles, and the method further comprising:

comparing the counter signal with a most significant bits portion of the integer value indicative of the duty cycle at least during a portion of respective duty cycles of the pulse width modulated signal;

producing an input signal to a delay locked loop (DLL) based on a result of said comparing; and delaying the input signal of the DLL by one or more successive delay elements of the DLL.

13. The method of claim 12, wherein said comparing is performed in response to a most significant bit of the counter signal being equal to 1.

14. The method of claim 8, wherein the pulse width modulated signal includes a plurality of switching cycles, and the method further comprising:

comparing the counter signal with a most significant bits portion of the bitwise negated integer value at least during a portion of each of the respective duty cycles of the pulse width modulated signal.

15. The method of claim 14, wherein said comparing is performed in response to a most significant bit of the counter being equal to 0.

16. The method of claim 8, further comprising:

producing a control signal to a DLL based on a least significant bits portion of the bitwise negated integer value, wherein a number of bits contained in the least significant bits portion of the bitwise negated integer value is based on one or more successive delay elements of the DLL.

17. A system comprising:

a processor;

a voltage source configured to provide a voltage signal to the processor;

a bitwise negator configured to bitwise negate each of a plurality of bits of an integer value indicative of a duty cycle of a pulse width modulated signal, wherein the duty cycle of the pulse width modulated signal determines an effective voltage received by the load; and a counter coupled to the bitwise negator, and configured to produce a counter signal based on a clock signal, wherein the counter and the bitwise negator are further configured to cooperatively facilitate a production of the pulse width modulated signal based on the bitwise negated integer value.

18. The system of claim 17, further comprising:

a delay locked loop (DLL) coupled to the bitwise negator and the counter;

wherein the counter has a first resolution;

wherein the DLL has a second resolution;

wherein the duty cycle has a third resolution; and wherein a combined resolution of the counter and the DLL based on the first resolution and the second resolution is equal to or higher than the third resolution of the duty cycle.

19. The system of claim 17, further comprising one or more logic gates coupled to the bitwise negator and the DLL and configured to produce an input signal to the DLL based on a most significant bits portion of the bitwise negated integer value indicative of the duty cycle, wherein the input signal to the DLL is to be delayed by one or more delay elements of the DLL.

20. The system of claim 17, wherein the integer value indicative of a duty cycle of a pulse width modulated signal equals to about half of the duty cycle of the pulse width modulated signal, and the system further comprises a divider configured to divide another integer value representing the duty cycle of the pulse width modulated signal to produce the integer value equals to about half of the duty cycle of the pulse width modulated signal.

* * * * *